(12) United States Patent
Cheng et al.

(10) Patent No.: US 7,621,683 B2
(45) Date of Patent: Nov. 24, 2009

(54) COMPACT CAMERA MODULE AND THE SUBSTRATE THEREOF

(75) Inventors: She-Hong Cheng, Tainan (TW); Kuo-Hua Chen, Magong (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 602 days.

(21) Appl. No.: 11/556,530

(22) Filed: Nov. 3, 2006

(65) Prior Publication Data

US 2007/0196103 A1 Aug. 23, 2007

(30) Foreign Application Priority Data

Feb. 22, 2006 (TW) .............................. 95105991 A

(51) Int. Cl.
*G03B 17/00* (2006.01)
(52) U.S. Cl. ..................... 396/529; 396/532; 438/975
(58) Field of Classification Search ................ 396/529; 438/975
See application file for complete search history.

(56) References Cited

U.S. PATENT DOCUMENTS

| | | | |
|---|---|---|---|
| 2003/0090661 A1* | 5/2003 | Kobayashi | 356/400 |
| 2005/0062949 A1* | 3/2005 | Irie | 355/53 |
| 2005/0189502 A1* | 9/2005 | Van Bilsen et al. | 250/559.3 |

\* cited by examiner

*Primary Examiner*—WB Perkey
*Assistant Examiner*—Dennis Hancock

(57) ABSTRACT

A compact camera module (CCM) substantially includes a substrate, a sensor chip and a lens module. The substrate has a surface defining a chip-attached area for attaching the sensor chip and a module-secured area for mounting the lens module. A check point is defined in the chip attached area. The module-secured area surrounds the chip-attached area. The substrate includes a plurality of connecting pads and a plurality of check bars disposed outside the chip-attached area, wherein the perpendicular bisectors of the check bars intersect with each other at a point aligning with the check point. Accordingly, a self-check step can be performed to check the center of the sensor area of the sensor chip in accordance with the intersection point after a chip is attached.

20 Claims, 4 Drawing Sheets

US 7,621,683 B2

COMPACT CAMERA MODULE AND THE SUBSTRATE THEREOF

CROSS REFERENCE TO RELATED APPLICATION

This application claims the priority benefit of Taiwan Patent Application Serial Number 095105991 filed Feb. 22, 2006, the full disclosure of which is incorporated herein by reference.

BACKGROUND OF THE INVENTION

1. Field of the Invention

The present invention relates to a compact camera module and the substrate thereof, and more particularly, to a compact camera module that can perform a self-check after a chip is attached and the substrate thereof.

2. Description of the Related Art

Compact camera modules (CCMs) are a type of compact image capturer and can be adopted in compact camcorders, digital still cameras or in electronic devices, such as cell phones, laptop computers and hand-held computers. The compact camera module substantially includes an image sensor chip disposed on a substrate and a barrel-shaped lens module with a lens. Rays of light can pass through the lens and reach the sensor area of the image sensor chip. The information of the captured image light is transformed into a digital format that can be saved in a storage medium. In order to avoid causing image distortion, it is required to precisely align the center of the sensor area of the sensor chip with the center of the lens module.

Referring to FIG. 1, a conventional substrate 110 for compact camera modules includes an upper surface 111 defining a chip-attached area 112, and a module-secured area 113. The chip-attached area 112 is substantially square and adapted to receive a sensor chip attached thereon. The module-secured area 113 surrounds the chip-attached area 112 and is adapted to carry a lens module mounted thereon. The area between the chip-attached area 112 and module-secured area 113 is provided with a plurality of connecting pads 114 and a plurality of fiducial marks 115. In accordance with compact camera module design, a check point 116 is defined in the chip-attached area 112 to calibrate the center of the sensor area of the sensor chip. The fiducial marks 115 are helpful to identify the location of the chip-attached area 112 and therefore can facilitate the attaching of the sensor chip to the chip-attached area 112. After the sensor chip is attached to the chip-attached area 112, the lens module is mounted on the module-secured area 113 to form the compact camera module. However, the use of the fiducial marks 115 to assist to attach the sensor chip to the chip-attached area 112 is apt to cause the center of the sensor area of the sensor chip not to be placed in the predetermined position and therefore cannot precisely align with the center of the lens module. This will cause the image distortion of the compact camera module. In addition, according to the conventional substrate design, the check point 116 fails to help to identify whether the center of the sensor area of the sensor chip deviates from its predetermined position in the chip-attached area 112 when the sensor chip has been attached to the chip-attached area 112. It is not uncommon to check the image performance of the lens module to identify whether the center of the sensor area of the sensor chip deviates from its predetermined position after the lens module has been mounted on the module-secured area 113. When the deviation of the sensor chip occurs, it is required to detach the sensor chip and lens module from the substrate 110 and then attach them back to the substrate 110 again according to the revised process parameters. After the sensor chip is attached to the substrate 110, it is unable to self-check the relative position of the sensor area of the sensor chip to substrate 110.

Accordingly, there exists a need to provide a substrate for compact camera modules to solve the aforesaid problems.

SUMMARY OF THE INVENTION

It is an object of the present invention to provide a compact camera module and the substrate thereof. The substrate includes a plurality of check bars disposed outside the chip-attached area. The intersection point of the perpendicular bisectors of the check bars aligns with a check point defined on the substrate so as to facilitate self-checking the relative position of the sensor area of the sensor chip to the substrate and/or a lens module, thereby ensuring the center of the sensor area aligns with the intersection point of the perpendicular bisectors. In addition, the check bars can be functioned as reference points to help to precisely attach the sensor chip to the predetermined position in the chip-attached area.

In accordance with the present invention, a compact camera module includes a substrate, a sensor chip and a lens module. The substrate has an upper surface defining a chip-attached area adapted to receive the sensor chip attached thereon and a module-secured area adapted to carry the lens module mounted thereon. The module-secured area surrounds the chip-attached area and a check point is defined in the chip-attached area. The substrate includes a plurality of connecting pads and a plurality of check bars disposed outside the chip-attached area. The perpendicular bisectors of the check bars intersect with each other at a point that aligns with the check point. Therefore, the check bars can help to self-check whether the center of the sensor area of the sensor chip aligns with the check point.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1:
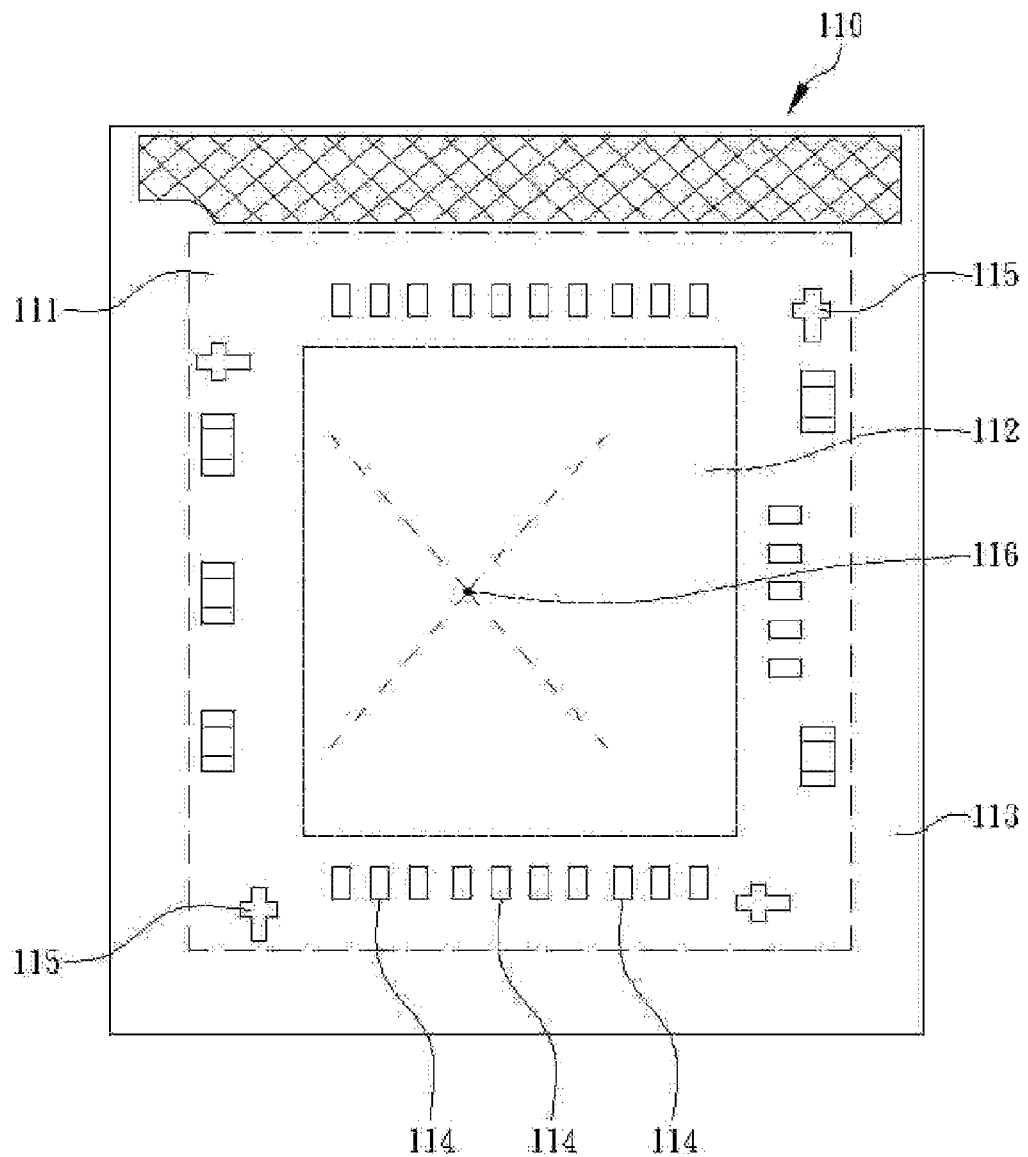
FIG. 1 is a top view of a conventional substrate for compact camera modules.
Figure 2:
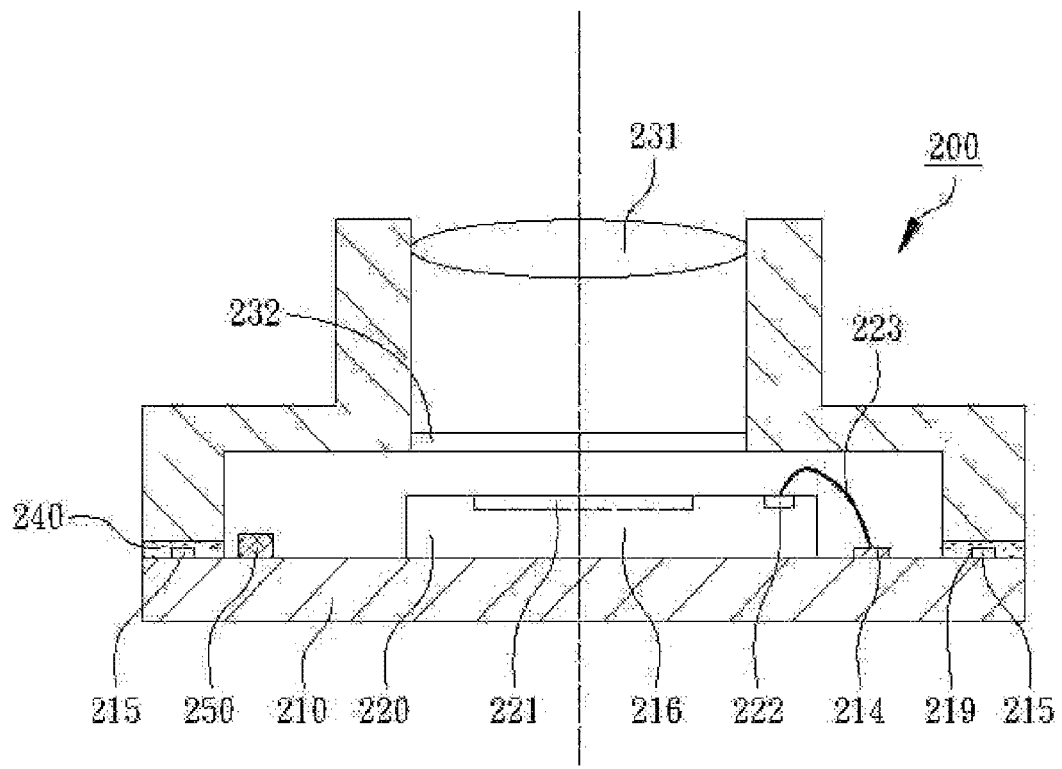
FIG. 2 is a cross-sectional view of a compact camera module according to an embodiment of the present invention.
Figure 3:
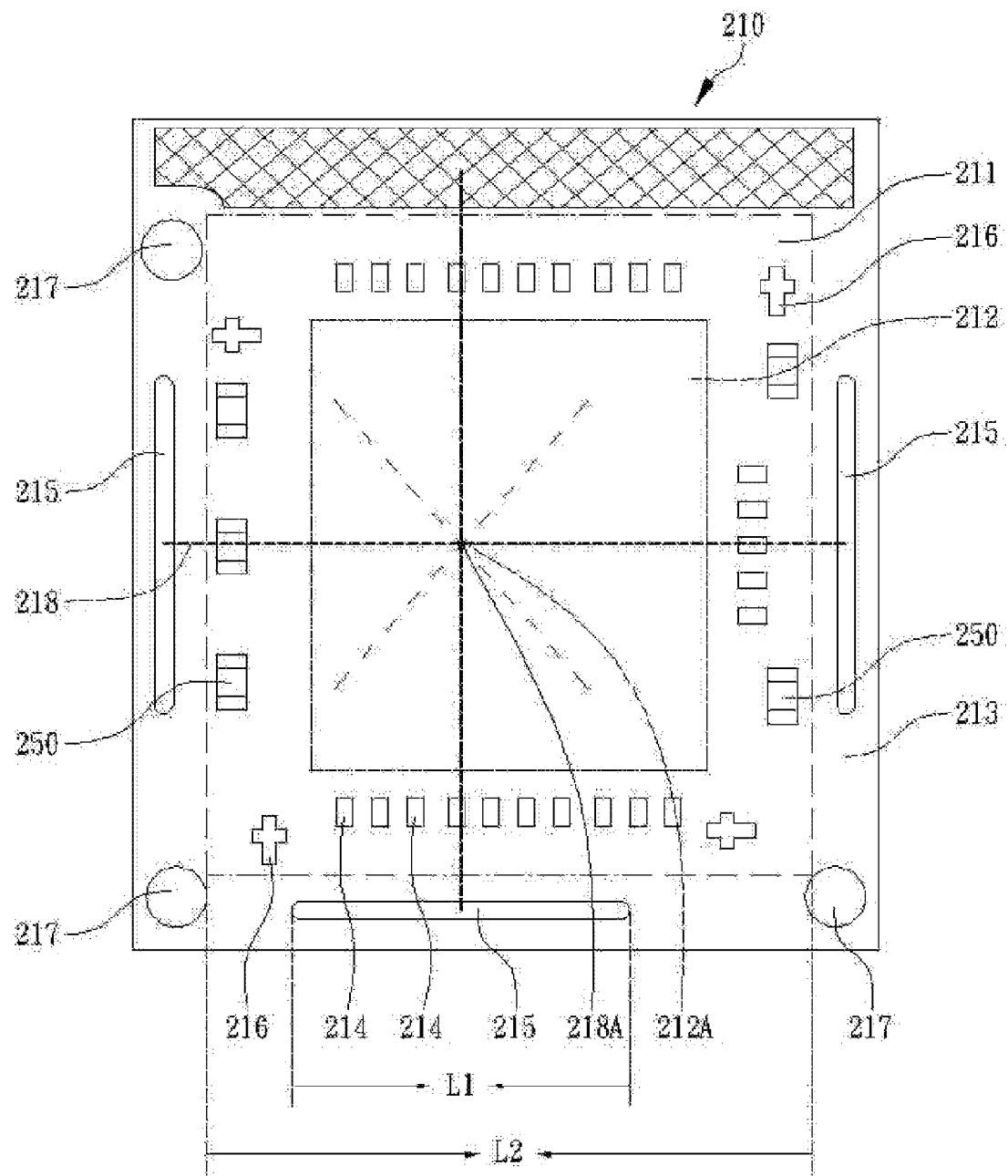
FIG. 3 is a top view of a substrate for compact camera modules according to an embodiment of the present invention.

FIG. 2 illustrates a cross-sectional view of a compact camera module according to one embodiment of the present invention. FIG. 3 illustrates a top view of a substrate for compact camera modules and FIG. 4 illustrates a top view of the substrate of FIG. 3 with a chip attached thereon.

Referring to FIG. 2, the compact camera module 200 includes a substrate 210, a sensor chip 220 and a lens module 230. The substrate 210 is a chip carrier and the sensor chip 220 and lens module 230 are disposed on the upper surface 211 of the substrate 210. In this embodiment, the sensor chip 220 is a CMOS sensor chip that has a sensor area 221 for sensing rays of light and a plurality of contact pads 222. The lens module 230 has a lens 231 and a filter 232. In addition, a plurality of passive components 250 is disposed on the upper surface 211 of the substrate 210.

Referring to FIG. 3, the upper surface 211 of the substrate 210 defines a chip-attached area 212, a module-secured area 213 and a check point 212A, wherein the chip-attached area 212 is adapted to receive the sensor chip 220 attached thereon and the module-secured area 213 is adapted to be carry the lens module 230 mounted thereon. The module-secured area 213 surrounds the chip-attached area 212 and the check point 212A is in the chip-attached area 212. The substrate 210 includes a plurality of connecting pads 214 and a plurality of check bars 215 disposed outside the chip-attached area 212. The perpendicular bisectors of the check bars 215 intersect with each other at a point 218A that aligns with the check point 212A so as to self-check whether the sensor area 221 of the sensor chip 220 deviates from its predetermined position in the chip-attached area 212 after the sensor chip 220 has been attached to the chip-attached area 212. In this embodiment, the check point 212A and the point 218A align with each other. The check bars 215 are separated from each other and arranged in substantially L-shape, U-shape or the shape of a rectangle. Preferably, the connecting pads 214 are disposed on the trace area between the chip-attached area 212 and the module-secured area 213. The check bars 215 are disposed on the module-secured area 213 so as to avoid influencing the layout of traces. In this embodiment, the substrate 210 further includes a plurality of fiducial marks 216 that are arranged between the chip-attached area 212 and module-secured area 213 so as to facilitate the attaching of a chip to the chip-attached area 212. In addition, the check bars 215 can be functioned as reference points to help to precisely attach the sensor chip 220 to the predetermined position in the chip-attached area 212.

Figure 4:
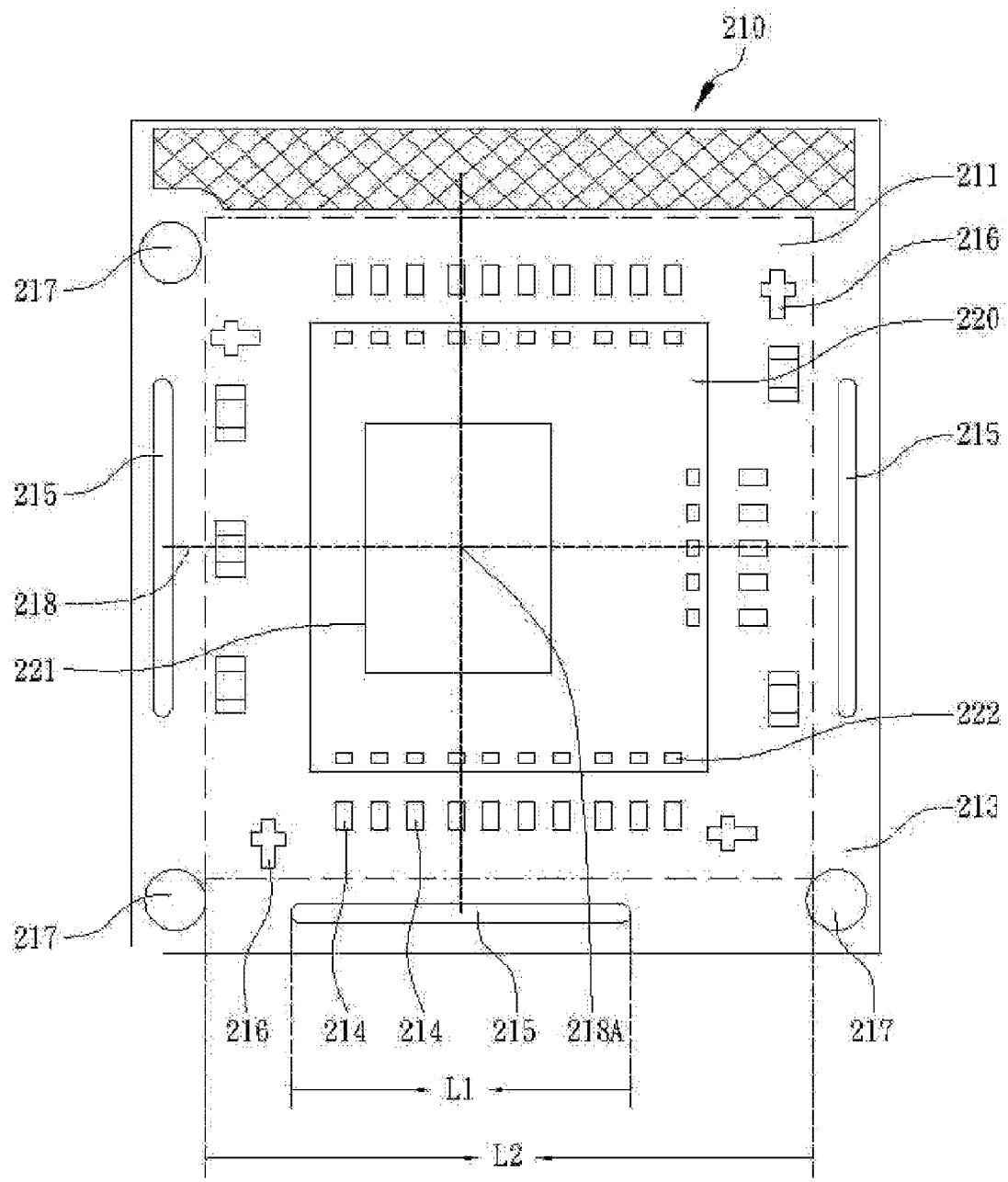
FIG. 4 is a top view of the substrate of FIG. 3 with a chip attached thereon when a self-check step is performed according to an embodiment of the present invention.

Referring to FIG. 4, the sensor chip 220 is attached to the chip-attached area 212. The positions of the check bars 215 on the substrate 210 can be quickly located through the apparatus that has a function of photographing and calculation. The apparatus can draw the imaginary perpendicular bisectors 218 of the check bars 215 and identify the point 218A of intersection of these imaginary perpendicular bisectors 218 according to the preset parameters. The point 218A can help to self-check whether the center of the sensor area 221 of the sensor chip 220 deviates from the point 218A after the sensor chip 220 is attached to the chip-attached area 212. In this embodiment, the center of the sensor area 221 and the point 218A align with each other. Referring again to FIG. 2, a plurality of bonding wires 223 electrically connect the connecting pads 214 of the substrate 210 to the contact pads 222 of the sensor chip 220. An adhesive 240 is used to mount the lens module 230 on the module-secured area 213 of the substrate 210. In addition, the adhesive 240 covers the check bars 215. The center of the lens 231 aligns with that of the sensor area 221 of the sensor chip 220 so as to raise the image performance of the compact camera module 200. The compact camera module 200 can self-check the relative position of the sensor chip 220 to the lens module 230 to identify whether the sensor chip 220 deviates from its predetermined position in the chip-attached area 212 and thereby avoid an image distortion.

Preferably, the check bars 215 are coated with a layer of gold 219 (see FIG. 2) and not covered by the solder mask on the substrate 210. Furthermore, the check bars 215 have substantially the same length to allow a quick drawing of the perpendicular bisectors 218 of the check bars 215 and finding the point 218A of intersection of the perpendicular bisectors 218. In this embodiment, as shown in FIG. 3, the length L1 of the check bar 215 is about one half of the length L2 of the edge of the inner side of the lens module 230. The widths of the check bars 215 are at least 20 µm and about identical to that of the traces deployed on the substrate 210.

In addition, referring back to FIG. 3, the module-secured area 213 of the substrate 210 has a plurality of positioning holes 217 for receiving a plurality of positioning pins of the lens module 230 (not shown in the figure). Preferably, three positioning holes 217 are arranged at three of the corners of the substrate 210 and the lens module 230 has three corresponding positioning pins. This will restrict the lens module 230 to the same orientation on the substrate 210 when the lens module 230 is mounted on the module-secured area 213

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A compact camera module, comprising:
   a substrate defining a chip-attached area and a module-secured area surrounding the chip-attached area, the substrate having a plurality of connecting pads and a plurality of check bars disposed outside the chip-attached area, wherein the perpendicular bisectors of the check bars intersect with each other at a point;
   a sensor chip attached to the chip-attached area, wherein the sensor chip comprises a sensor area, and the center of the sensor area aligns with the intersection point of the perpendicular bisectors of the check bars; and
   a lens module mounted on the module-secured area.

2. The compact camera module as claimed in claim 1, wherein the check bars are disposed in the module-secured area.

3. The compact camera module as claimed in claim 2, wherein the connecting pads are disposed between the chip-attached area and the module-secured area.

4. The compact camera module as claimed in claim 1, wherein the check bars have substantially the same length.

5. The compact camera module as claimed in claim 1, wherein the lengths of the check bars are about one half of the length of the edge of the inner side of the lens module.

6. The compact camera module as claimed in claim 1, wherein the widths of the check bars are at least 20 µm.

7. The compact camera module as claimed in claim 1, wherein the substrate further comprises a plurality of fiducial marks arranged between the chip-attached area and module-secured area.

8. The compact camera module as claimed in claim 1, wherein the lens module comprises a plurality of positioning pins, and the substrate further comprises a plurality of corresponding positioning holes arranged at the corners of the substrate for receiving the positioning pins.

9. The compact camera module as claimed in claim 1, further comprising an adhesive for mounting the lens module on the substrate and covering the check bars.

10. The compact camera module as claimed in claim 1, further comprising a plurality of passive components disposed on the substrate.

11. The compact camera module as claimed in claim 1, wherein the check bars are separated from each other and arranged in substantially L-shape, U-shape or the shape of a rectangle.

12. A substrate for compact camera modules, comprising:
a surface defining a chip-attached area, a module-secured area surrounding the chip-attached area and a check point arranged in the chip-attached area;
a plurality of connecting pads disposed on the surface; and
a plurality of check bars disposed on the surface and outside the chip-attached area, wherein the intersection point of the perpendicular bisectors of the check bars aligns with the check point.

13. The substrate for compact camera modules as claimed in claim 12, wherein the check bars are disposed in the module-secured area.

14. The substrate for compact camera modules as claimed in claim 13, wherein the connecting pads are disposed between the chip-attached area and the module-secured area.

15. The substrate for compact camera modules as claimed in claim 12, wherein the check bars are coated with a layer of gold.

16. The substrate for compact camera modules as claimed in claim 12, wherein the check bars have substantially the same length.

17. The substrate for compact camera modules as claimed in claim 12, wherein the widths of the check bars are at least 20 μm.

18. The substrate for compact camera modules as claimed in claim 12, further comprising a plurality of fiducial marks arranged on the surface and between the chip-attached area and module-secured area.

19. The substrate for compact camera modules as claimed in claim 12, further comprising a plurality of positioning holes arranged at the corners of the substrate.

20. The substrate for compact camera modules as claimed in claim 12, wherein the check bars are separated from each other and arranged in substantially L-shape, U-shape or the shape of a rectangle.

* * * * *